United States Patent [19]
Bhagwan

[11] Patent Number: 5,912,574
[45] Date of Patent: Jun. 15, 1999

[54] DUAL LOOP PLL WITH SECONDARY LOOP TO ACHIEVE 50% DUTY CYCLE

[75] Inventor: Raghunand Bhagwan, Sunnyvale, Calif.

[73] Assignee: Sun Microsystems, Inc., Palo Alto, Calif.

[21] Appl. No.: 08/762,154

[22] Filed: Dec. 9, 1996

[51] Int. Cl.$^6$ ................................................... H03K 3/017
[52] U.S. Cl. .................. 327/157; 327/175; 327/298; 331/34
[58] Field of Search ...................... 327/147, 148, 327/155, 156, 157, 172, 175, 298, 299, 149, 158; 331/34, 17

[56] References Cited

U.S. PATENT DOCUMENTS

| | | | |
|---|---|---|---|
| 4,959,557 | 9/1990 | Miller | 327/175 |
| 5,057,702 | 10/1991 | Kitagawa et al. | 327/175 |
| 5,345,186 | 9/1994 | Lesmeister | 327/156 |
| 5,371,425 | 12/1994 | Rogers | 327/3 |
| 5,477,180 | 12/1995 | Chen | 327/175 |
| 5,572,158 | 11/1996 | Lee et al. | 327/175 |

*Primary Examiner*—Timothy P. Callahan
*Assistant Examiner*—Eunja Shin
*Attorney, Agent, or Firm*—Robert Platt Bell & Associates, P.C.

[57] ABSTRACT

A phased lock loop (PLL) clock circuit generates a clock signal at 1x the desired clock frequency while maintaining substantially a 50% duty cycle. A first loop provides a feedback signal to maintain clock frequency, while a second loop provides a feedback signal and controls duty cycle. Two clock signals from a ring oscillator are fed to a level shifter, where each clock signal triggers a respective rising or trailing edge of the output clock signal. The level shifter is provided with a delay for controlling timing of the trailing edge of the output clock signal. The output clock signal is fed to a equi-current buffer where a charge pump, driven by the output clock signal, charges and discharges a capacitor in proportion to the duty cycle of the output clock signal, producing a feedback control voltage. The feedback control voltage is applied to the delay of the level shifter to maintain a substantially 50% duty cycle. The clock circuit of the present invention has improved power supply noise immunity and control voltage headroom for operation at different design frequencies.

21 Claims, 12 Drawing Sheets

DUAL LOOP PLL WITH SECONDARY LOOP TO ACHIEVE 50% DUTY CYCLE

CROSS-REFERENCE TO RELATED APPLICATIONS

The subject matter of the present application is related to that in U.S. patent application Ser. No. 08/702,974, filed Aug. 26, 1996, now U.S. Pat. No. 5,864,572 entitled OSCILLATOR RUNAWAY DETECT AND RESET CIRCUIT FOR PLL CLOCK GENERATOR, and U.S. patent application Ser. No. 08/759,533, entitled CURRENT REGULATED VOLTAGE CONTROLLED OSCILLATOR WITH DUTY CYCLE CORRECTION OVER A WIDE FREQUENCY RANGE, both of which are assigned to the same assignee as the present application.

FIELD OF THE INVENTION

The present invention relates generally to a Phase Locked Loop (PLL) for an on-chip clock generator. In particular, the present invention is directed towards an improved, high clock frequency PLL with a secondary loop for precise 50% duty cycle generation and minimized oscillator power supply sensitivity.

BACKGROUND OF THE INVENTION

High speed microprocessors may require clock signals in which duty cycle is tightly controlled. Duty cycle refers to the percentage of time a clock signal is "high" versus "low". In microprocessor applications, it might be desired for the clock signal to have a 50% duty cycle as illustrated in FIG. 1. In practical implementation, a clock signal with a 45%–55% duty cycle may be acceptable. Clock signals with imbalanced duty cycles beyond that range may introduce timing errors in a microprocessor system.

FIG. 2 illustrates a portion of a prior art PLL clock generator design using a typical technique for generating a clock with a substantially balanced duty cycle. In PLL 100 of FIG. 1, a current controlled oscillator 110 may be used to generate a clock at twice (2x) frequency of the processor, where x is the processor clock frequency. The 2x clock may then be divided by two in divider 120, producing a clock signal with a balanced duty cycle of approximately 50%.

A portion of the output of divider 120 may be fed back to phase frequency detector/charge pump 140 which in turn may compare this clock to a reference signal 190 and charge or discharge filter 150 in such a way as to equalize the phase and frequency of the reference and fed back clocks. Control voltage VCTRL is equal to supply voltage Vdd minus voltage VCAP across filter 150. Control voltage VCTRL may in turn be fed to voltage to current converter 130 to produce control current I. Note that other arrangements for filter 150 are also possible. For example, filter 150 may be referenced to ground instead of Vdd or a different type or order of filter may be used. As illustrated in FIG. 2, filter 150 may include a capacitance and a resistance.

Control current I may in turn control the frequency output of current controlled oscillator (CCO) 110. The use of divider 120 insures that the resultant clock signal will have a substantially balanced duty cycle.

However, the apparatus of FIG. 2 requires that a clock signal be generated at a frequency twice the design frequency of the system. At such high frequencies, phase jitter may become a problem due to worsened power supply rejection of the CCO. FIG. 3 is a graph illustrating power supply sensitivity of an oscillator.

On the X-axis of FIG. 3, control voltage VCAP is illustrated. On the Y-axis, corresponding clock frequency is illustrated. The upper, solid line curve illustrates the relationship between frequency and control voltage at a first power supply voltage Vdd=2.0 Volts. The lower, dotted line curve illustrates the relationship between frequency and control voltage at a second power supply voltage Vdd=1.6 Volts. The supply voltages Vdd in FIG. 3 are by way of example only and should not be construed as limiting the scope of the present invention in any way.

As illustrated in FIG. 3, frequency output from an oscillator may vary with changes in supply voltage. When designing a clock generator for a computer system, a designer must take into consideration potential changes in supply voltage due to temperature, load, ripple voltage, and the like. If supply voltage Vdd changes from 2.0 to 1.6 volts, oscillator frequency output may change accordingly, particularly at higher frequencies. Such changes in oscillator frequency may be cause frequency jitter and create timing problems within a processor.

As illustrated in FIG. 3, for a given oscillator design, power supply sensitivity may not be a problem below a particular threshold, for example 500 MHz. Thus, an oscillator operating below such frequencies may be relatively insensitive to changes in power supply voltage. However, if a processor is to operate at, for example, 400 MHz, a 2x oscillator frequency of 800 MHz may be required. At such frequencies, power supply sensitivity may become a problem.

Thus it would be desirable to have a PLL clock generator design in which the oscillator (VCO or CCO) operates at the frequency of the processor and not twice (2x) the frequency.

SUMMARY OF THE INVENTION

The present invention provides a dual-loop PLL architecture which does not rely upon dividing a 2x clock by 2 to achieve a 50% duty cycle. A five stage current controlled oscillator is used as a local oscillator, whose frequency is acquired and maintained by the main loop (frequency and phase acquisition loop). Duty cycle correction is built into the level shifter and precise 50% duty cycle is achieved by means of a secondary loop.

The local oscillator generates five output signals nominally 144 degrees apart from one another in phase. Two outputs A and B are taken from the five stage oscillator, where the rising edge of B follows the rising edge of A by 144 degrees. The rising edge of A is fed to a level shifter to produce a rising edge at the output of the level shifter. The rising edge of B is also fed to the level shifter to produce a falling edge at the level shifter.

The falling edge of the level shifter is delayed such that the rising edge and falling edge are 180 degrees from one another. The current in the fall leg of the level shifter is controlled by the secondary loop to achieve such a delay. Current to the fall leg is controlled by the use of a voltage-controlled-current source (VCCS).

An equi-current buffer coupled to the level shifter receives as its input the output signal from the level shifter as passed through a clock tree. The equi-current buffer contains a charge pump driven by the output signal of the level shifter. The charge pump charges a filter capacitor to generate a control voltage to control the VCCS in the level shifter. The level shifter, equi-current buffer and the filter capacitor form a second feedback loop to accurately control duty cycle of the output clock signal.

DETAILED DESCRIPTION OF THE INVENTION

Figure 1:
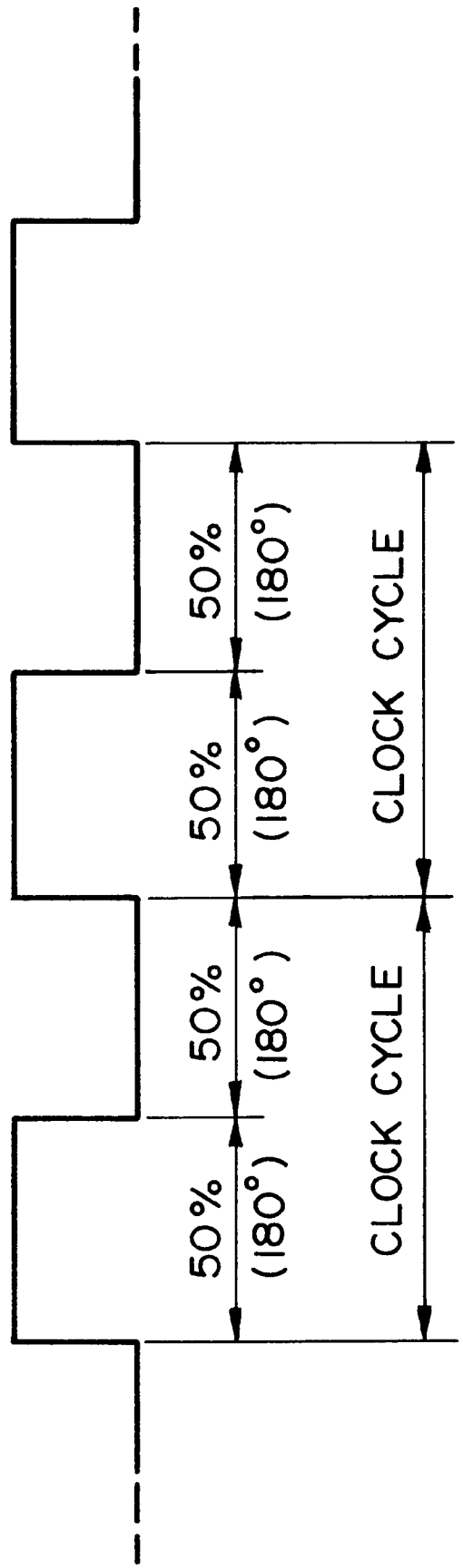
FIG. 1 is a waveform diagram illustrating a 50% clock duty cycle.
Figure 2:
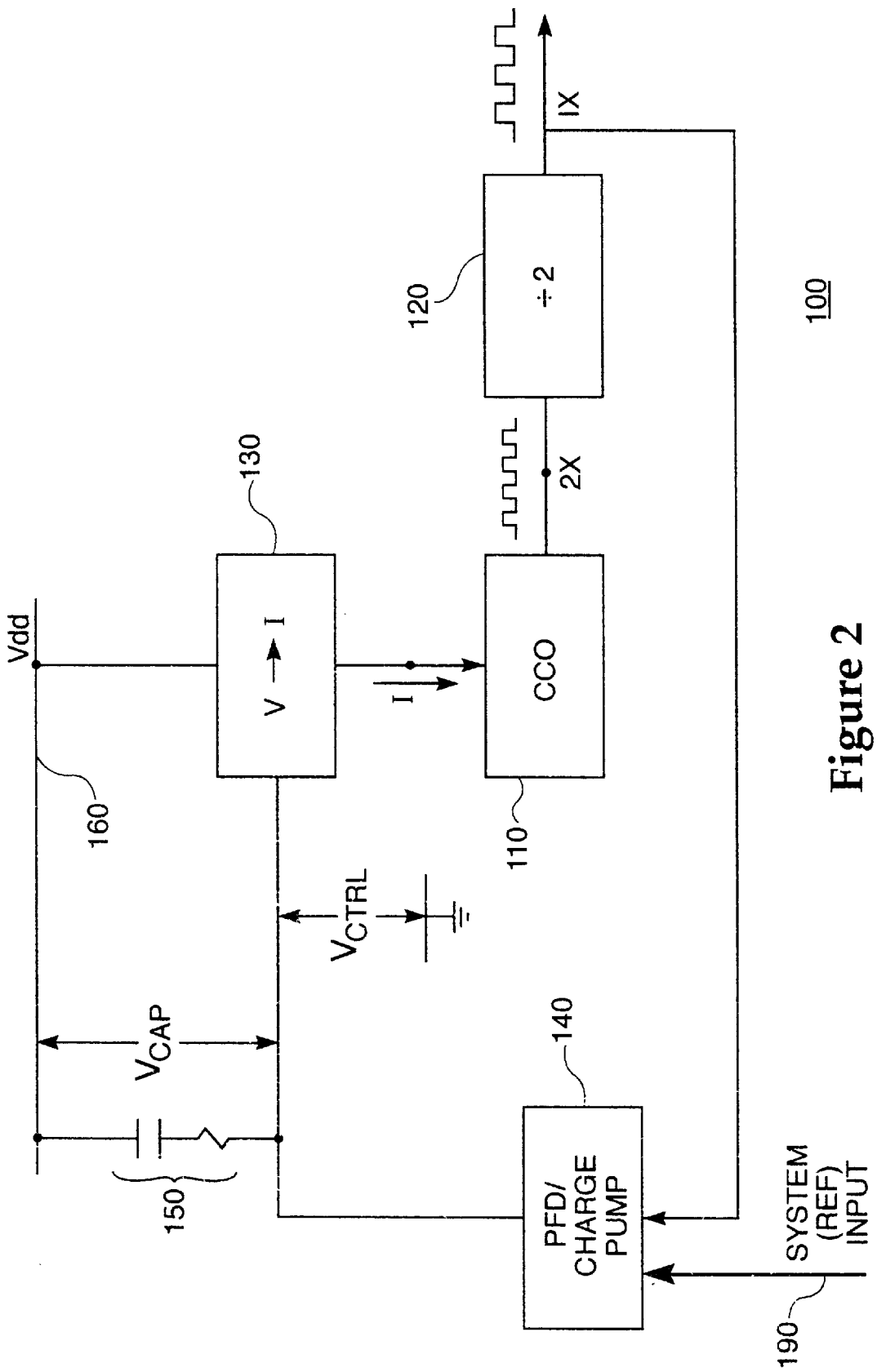
FIG. 2 is a block diagram illustrating a prior art PLL circuit using a 2x clock to achieve a substantially 50% duty cycle.
Figure 3:
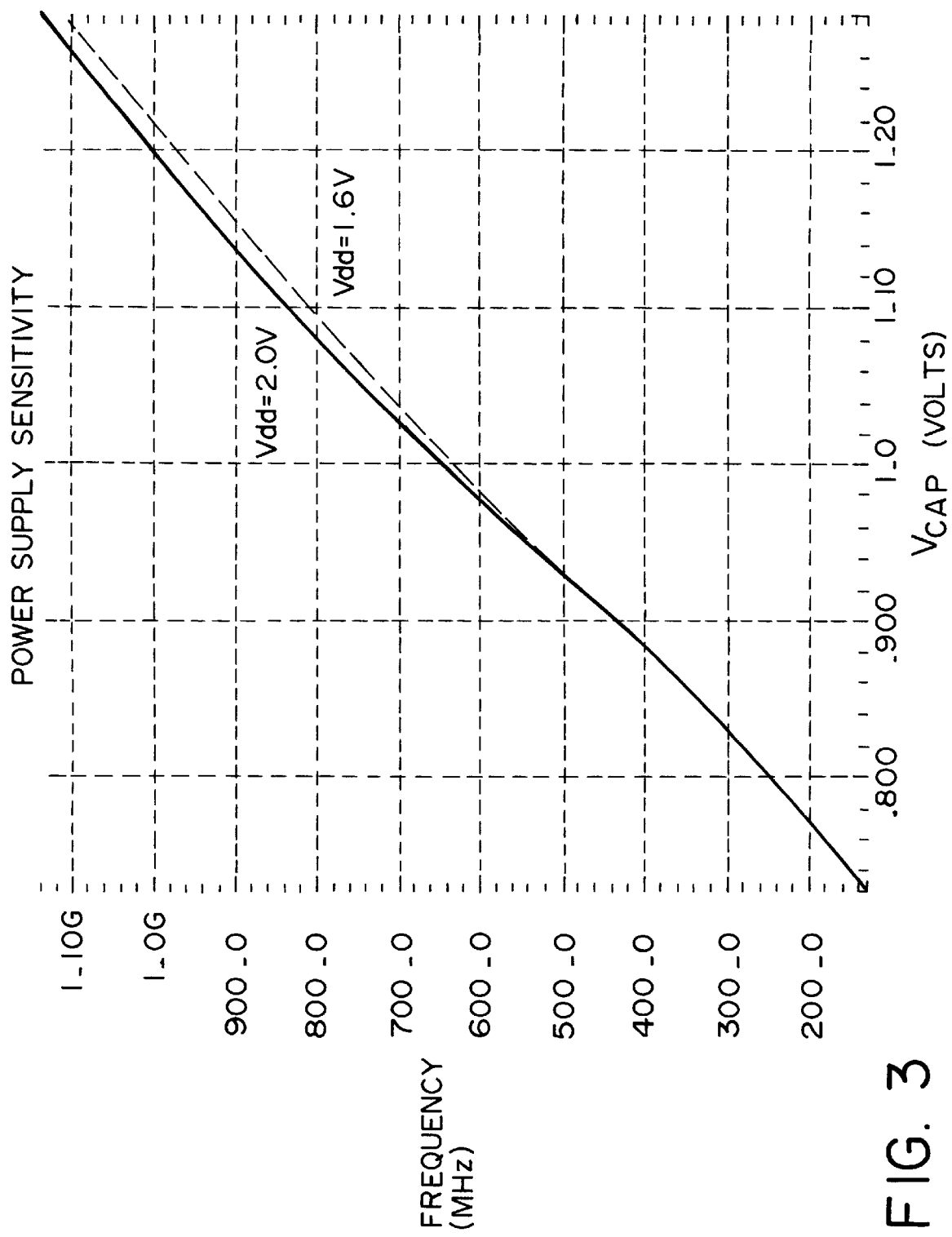
FIG. 3 is a graph illustrating the relationship between control voltage VCAP and clock frequency for different supply voltages Vdd.
Figure 4:
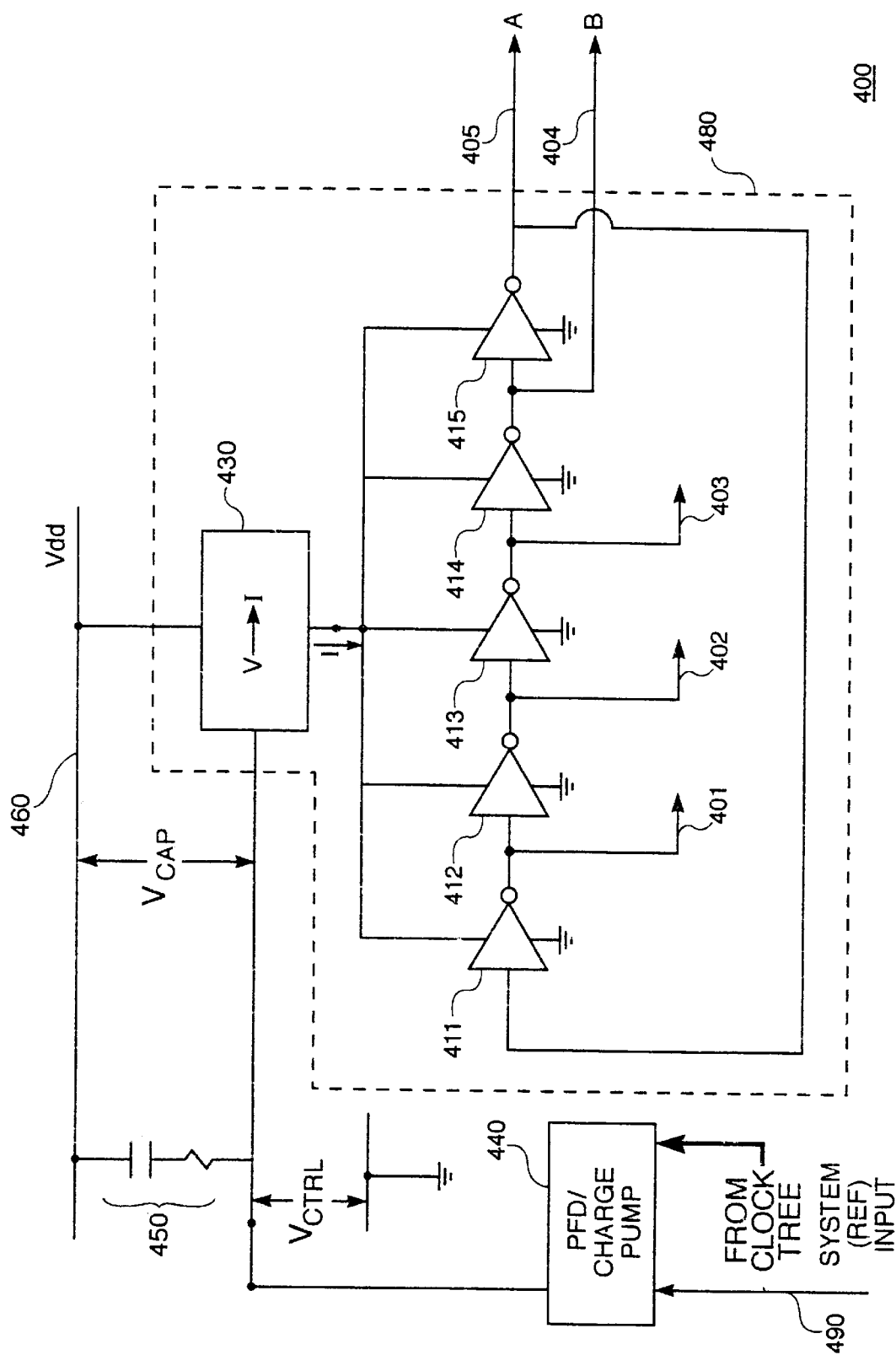
FIG. 4 is a simplified block diagram of the voltage controlled oscillator of the present invention.

FIG. 4 is a simplified block diagram of the Voltage controlled oscillator (VCO) 480 of the present invention. VCO 480 may comprise of voltage to current transducer 430 and a ring oscillator comprising the inverters 411, 412, 413, 414 and 415. Inverter circuits 411–415 may be supplied with a controlled current I such that VCO 480 will oscillate at a higher frequency as current I increases, and vice-versa.

Current I may be supplied by voltage to current transducer 430. Control voltage. VCTRL may be supplied by filter capacitor 450 to control the transducer 430 which regulates current I. Filter 450 may comprise, for example, an RC filter comprising a resistance and a capacitance, as illustrated in FIG. 4. The frequency of ring oscillator 400 may be proportional to current I, and the peak-to-peak amplitude of the outputs of inverters 411–415 may be proportional to the frequency generated by ring oscillator 480.

The voltage drop VCS across transducer 430 may be equal to the supply voltage Vdd minus the peak to peak voltage (Vp-p) of the outputs of inverters 411–415 as illustrated in Equation 1.

$$VCS = Vdd - Vp\text{-}p \qquad (1)$$

As frequency of ring oscillator 400 goes higher, voltage Vp-p also goes higher, reducing the voltage drop VCS across the transducer. A reduced voltage VCS provides less headroom to operate the current source(s) within voltage to current transducer 430. Less headroom results in less power supply noise rejection.

To overcome such difficulty, ring oscillator 480 of the present invention may be operated at a lower frequency equal to the desired operating frequency of the system, rather that twice (2x) the desired operating frequency, as in the prior art.

FIGS. 5A–E are waveform diagrams illustrating the output waveforms from outputs 401, 402, 403, 404 and 405 corresponding to inverters 411, 412, 413, 414, and 415, respectively of the ring oscillator of FIG. 4. As illustrated in FIGS. 5A–E, each waveform from outputs 401–405 may be inverted and 36 degrees out of phase with its predecessor. Each waveform from outputs 401–405 may have a duty cycle of approximately 50%, but the amplitudes may not be full rail to rail. Although the duty cycles of the waveforms from outputs 401–405 might have approximately 50% duty cycles, they might be used directly due to the small signal nature of their amplitudes. The duty cycle is largely unregulated and accurate precision is not required in the present invention as will be discussed below, due to the use of the dual loop architecture of the present invention. As illustrated in FIGS. 5D and 5E, the phase difference between the rising edge of signal A and the rising edge of signal B is 144 degrees.

Figure 5:
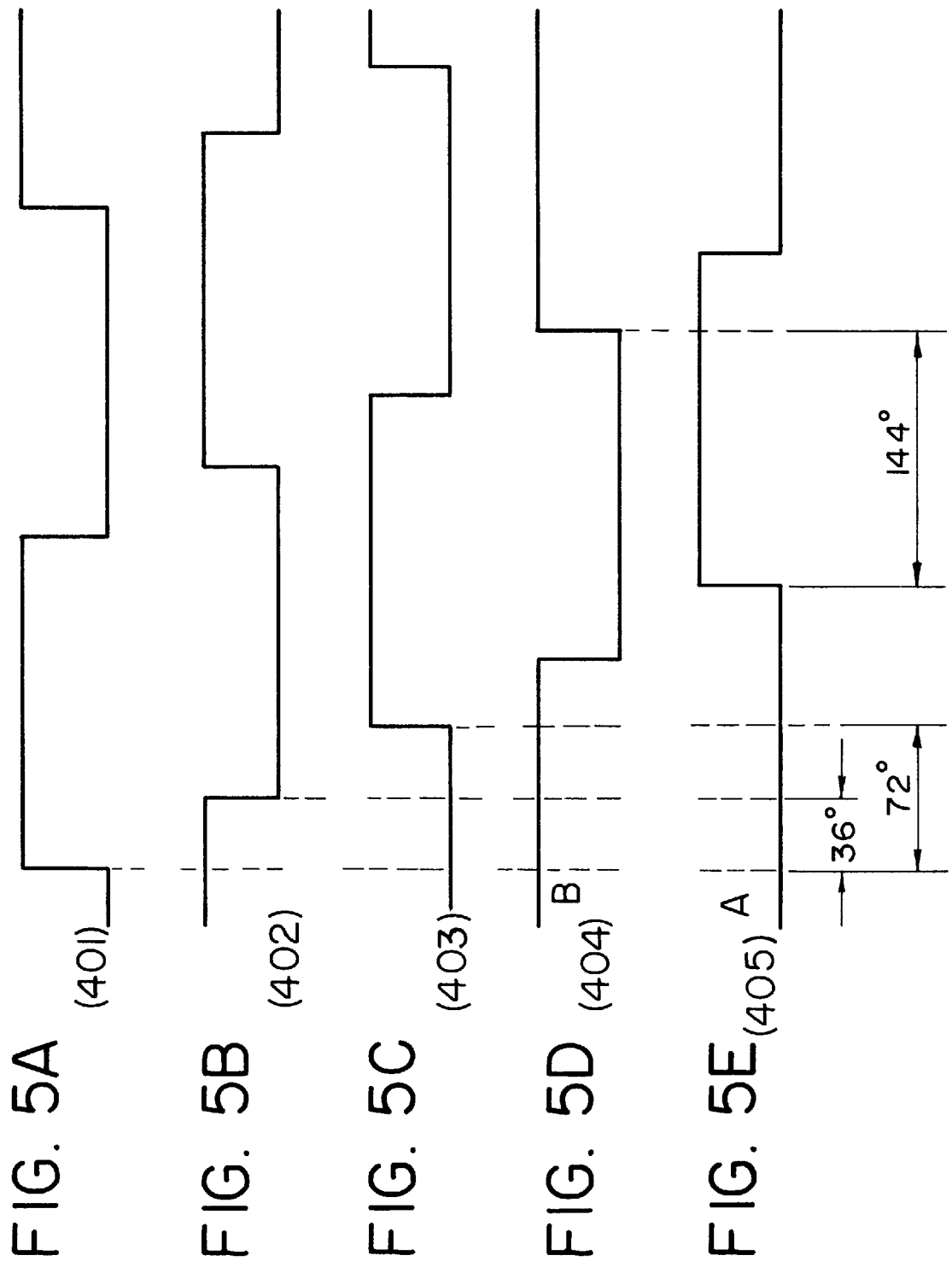
FIGS. 5A–E are waveform diagrams illustrating the outputs 401–405 of inverters 411–415 of FIG. 4.

Two outputs 401–405 from the ring oscillator of FIG. 4 may be utilized as outputs A and B, as illustrated in FIGS. 4 and 5. Other outputs may be used, so long as he two chosen outputs produce the 144 phase difference illustrated in FIGS. 5A–E.

Figure 6:
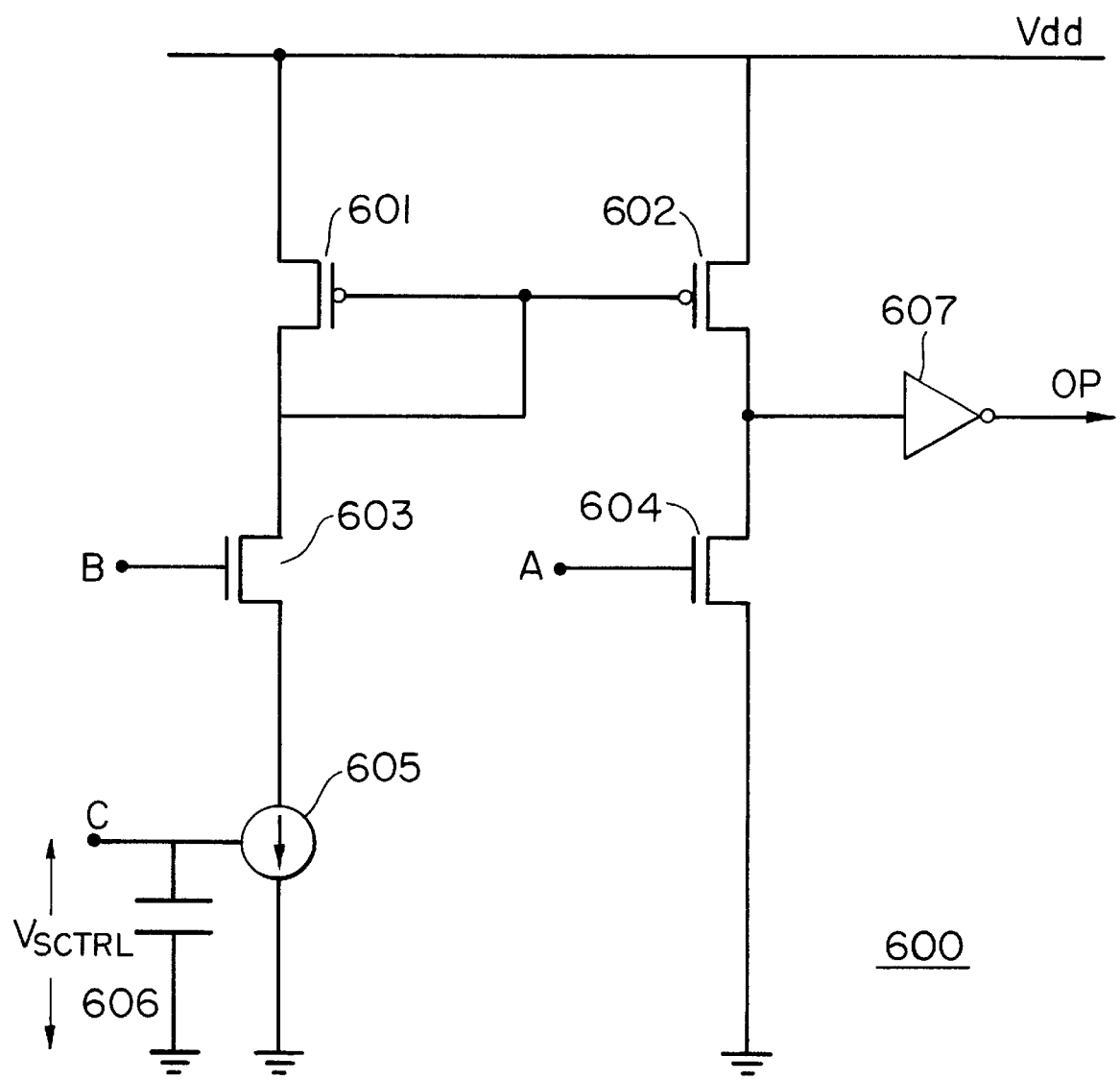
FIG. 6 is a simplified block diagram of a level shifter of the present invention which may be coupled to the output of the ring oscillator of FIG. 4.

FIG. 6 illustrates level shifter 600 of the present invention. Level shifter 600 receives as inputs signals A and B from VCO 480 of FIG. 4 and outputs a signal waveform OP. Waveform OP has a substantially 50% duty cycle and an amplitude swing from supply voltage Vdd to ground. As discussed above in connection with FIG. 4, due to voltage drops across voltage to current transducer 430, outputs A and B may be at an amplitude less than Vdd. Level shifter 600 therefore performs two functions; it creates a 50% duty cycle waveform and also raises the level of the output signal to near power supply voltage Vdd.

Figure 7:
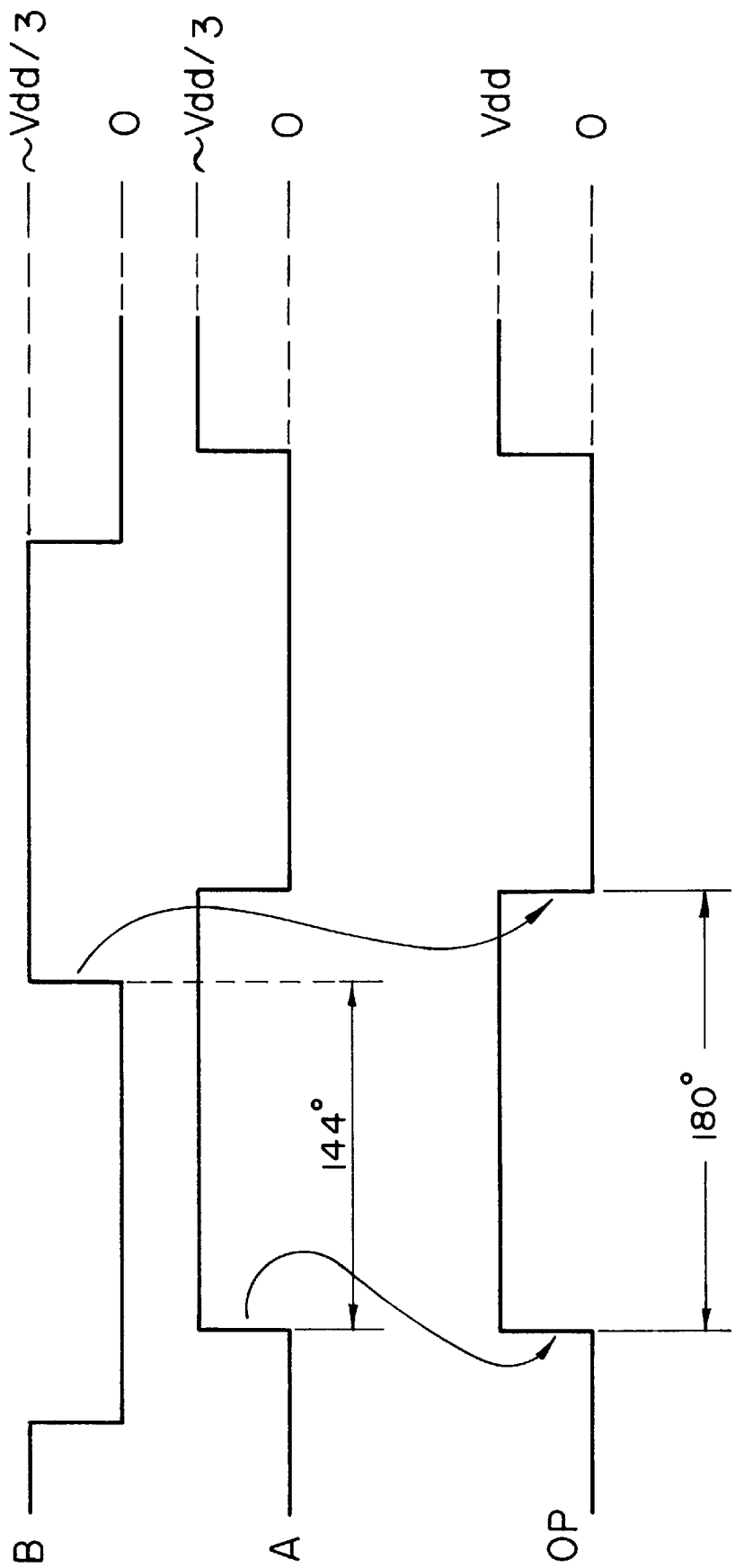
FIG. 7 is a waveform diagram illustrating the relationship between inputs A and B and output OP of the level shifter of FIG. 6.

Level shifter 600 receives input A at NMOS transistor 604. When input A goes high, NMOS transistor 604 is turned on and the input to inverter 607 is pulled low. The output of inverter 607 thus goes high a short time after input A goes high. FIG. 7 illustrates the relationship between input signals A and B and output signal OP. Note that the amplitude of input signals A and B are not to scale with output signal OP. A typical current controlled oscillator outputs a low amplitude signal (e.g., ~Vdd/3) and one function of level shifter 600, as discussed above, is to raise the level of output signal OP to a swing from substantially Vdd to ground.

As illustrated in FIG. 7 and discussed above, when input signal A goes high (rising edge), output signal OP is driven high. Note that for the purposes of illustration, these two events are shown as occurring simultaneously, however, one of ordinary skill in the art may appreciate that gate delays and the like may cause signal OP to go high a very short time after signal A goes high.

When signal B goes high (rising edge), PMOS transistor 603 may turn on. PMOS transistors 601 and 602 form a current mirror circuit. Current passing through PMOS transistor 602 is mirrored by current passing through PMOS transistor 601. When signal 3 goes high, NMOS transistor 603 is turned on and PMOS transistors 601 and 602 conduct, pulling the input to inverter 607 high and output OP low.

The circuit described so far in FIG. 6 would produce an output signal OP with a skewed duty cycle between 40 to 50%. Additional circuitry within FIG. 6, along with the equi-current buffer of FIG. 8 balance the duty cycle of signal OP as will now be discussed.

In order to achieve a balance duty cycle, it is desirable to delay the reaction between the rising edge of signal B and the falling edge of signal OP as is illustrated in FIG. 7.

Current source 605 is provided coupled to NMOS transistor 603. Current source 605 may itself comprise an NMOS transistor or transistors as is known in the art.

Current source 605 is controlled by secondary control voltage VSCTRL across capacitor 606. Current source 605 serves to reduce the current passing through NMOS transistor 603 and thus delaying switching of PMOS transistors 601 and 602.

If current source 605 acts as a short circuit, the resultant duty cycle of signal OP would be approximately 40%. However, by adjusting secondary control voltage VSCTRL, the trailing edge of signal OP may be delayed to adjust the duty cycle to approximately 50%. It may be possible to set secondary control voltage VSCTRL to a fixed value, however, due to changes in ambient conditions, supply voltage, and transient conditions, such a scheme may not accurately control duty cycle to substantially 50% as desired.

Figure 8:
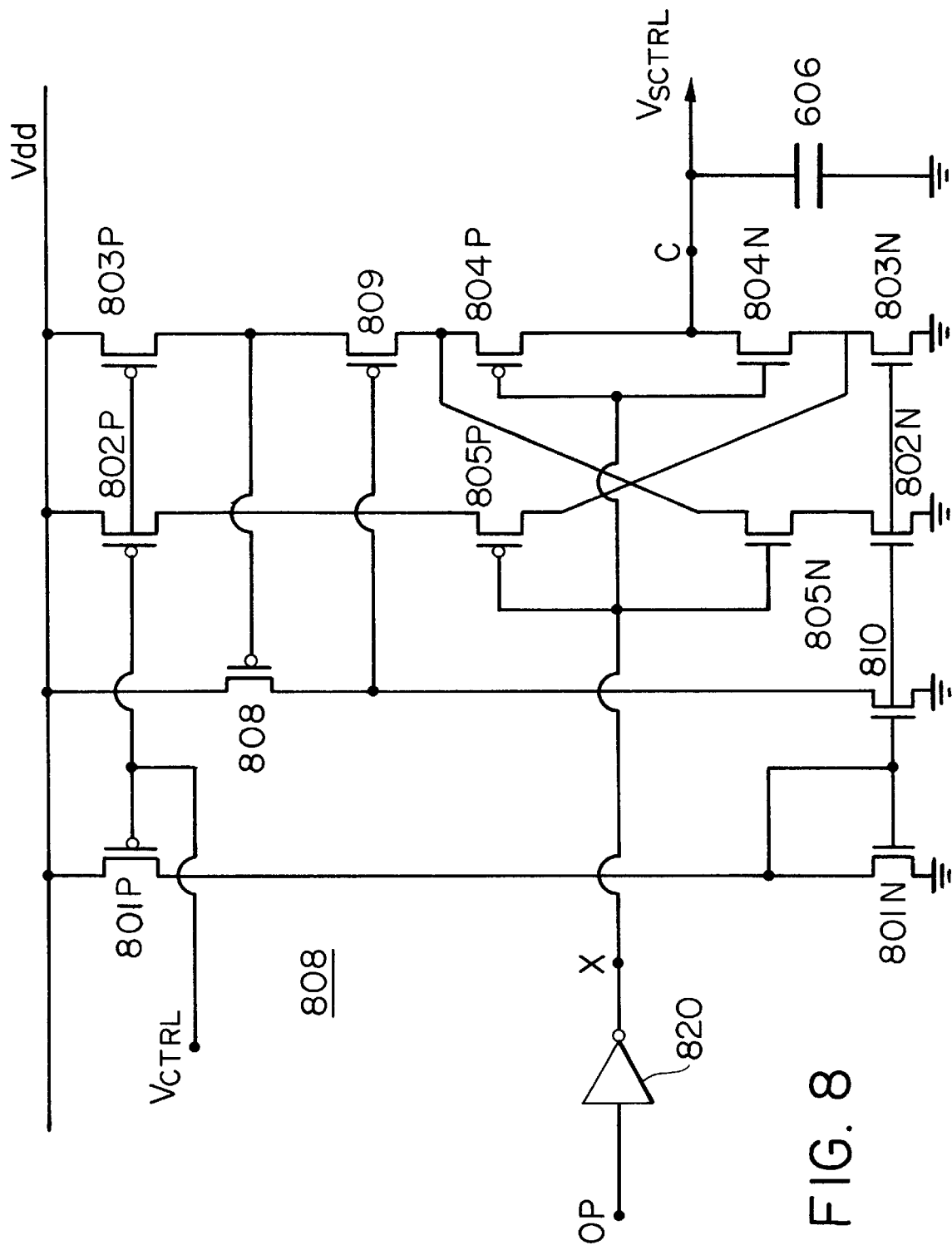
FIG. 8 is a schematic illustrating the major components of the equi-current buffer of the present invention.

FIG. 8 is a block diagram of the equi-current buffer 800 of the present invention. Equi-current buffer 800 receives, as its input, output signal OP and outputs secondary control voltage VSCTRL to node C of level shifter 600 of FIG. 6. Equi-current buffer 800 acts as a second feed back loop to adjust duty cycle.

The operation of equi-current buffer 800 will be described as follows in connection with FIGS. 8 and 9. An equi-current buffer is a buffer which produces equal charging and discharging currents at the output. If the input is high, it produces a positive charging current. If the input is low, it produces a negative charging current. The input to equi-current buffer 800 may comprise output signal OP, or output signal OP as tapped off from a portion of a processor clock tree. In the preferred embodiment, it may be desirable to tap off the clock tree to compensate for propagation delays and the like within a processor circuit.

Equi-current buffer 800 comprises switching circuits formed from transistors 804N, 804P, 805N, and 805P. When signal OP goes high, inverter 830 outputs a low signal, and PMOS transistors 804P and 805P turn on, while NMOS transistors 804N and 805N go off. With PMOS transistors 804P and 805P on, a positive charging current is output, charging control capacitor 606 from FIG. 6 (shown here for the purposes of illustration).

When signal Op goes low, inverter 820 outputs a high level logic signal, turning on NMOS transistors 804N and 805N and turning off PMOS transistors 804P and 805P. With NMOS transistors 804N and 805N on, a negative charging current is produced, discharging control capacitor 606. Thus, equi-current buffer 800 acts as a charge pump to continually charge and discharge control capacitor 606 to produce a desired secondary control voltage VSCTRL to control level shifter 600 of FIG. 6.

Figure 9A:
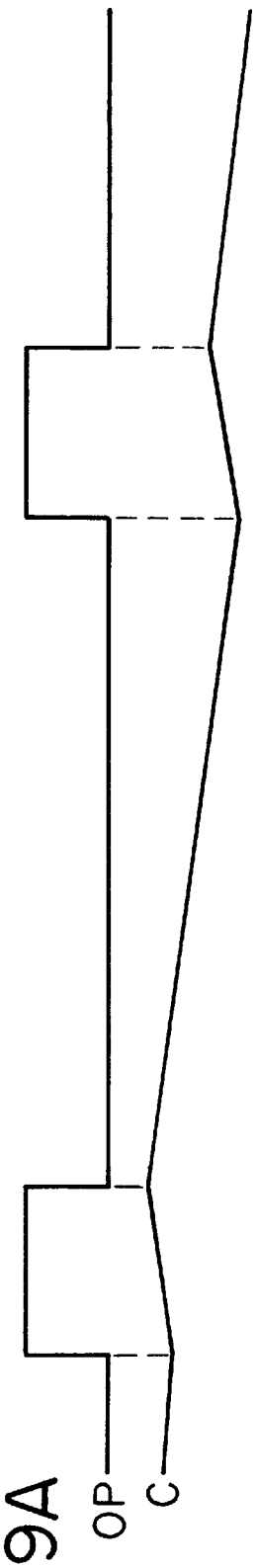
FIGS. 9A–C are waveform diagrams illustrating the operation of the equi-current buffer of FIG. 8 for three operating conditions.
Figure 9B:
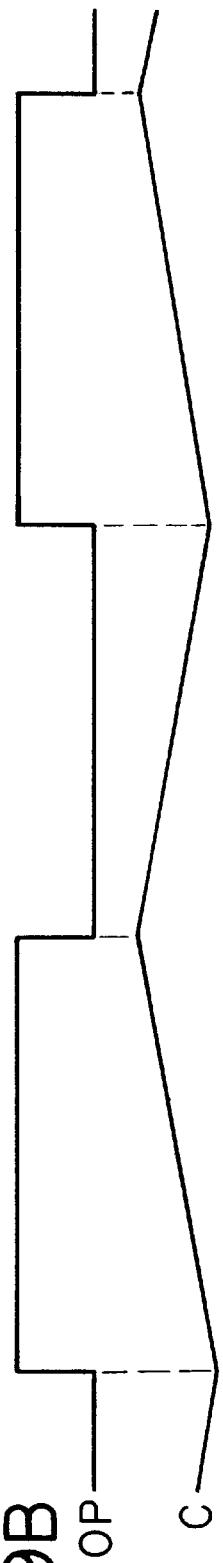
Figure 9C:
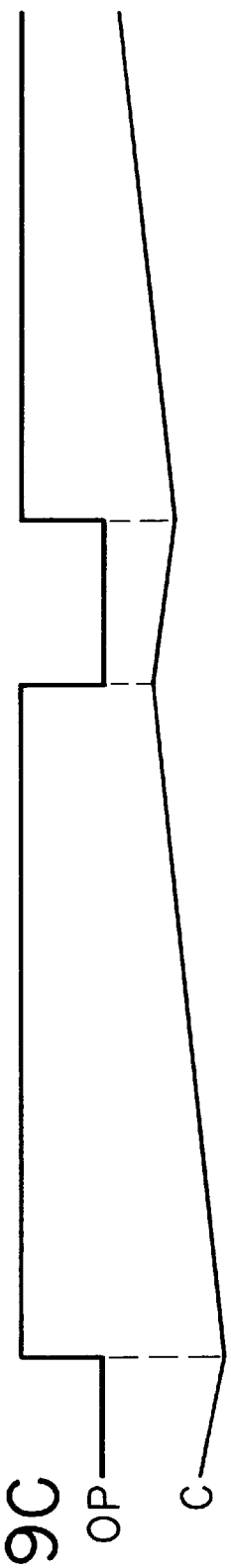

FIGS. 9A–C illustrate the operation of equi-current buffer 800 of FIG. 8 for three cases. In FIG. 9A, the duty cycle of signal OP is illustrated at an exaggerated 20%. The charge pump formed by transistors 804N, 804P, 805N and 805P outputs a signal at node C as illustrated in FIG. 9A. The slope of charging and discharging cycles are the same. As the duration of the charging cycle is smaller than the discharging cycle, capacitor 606 will decrease in charge over time, decreasing secondary control voltage VSCTRL.

As secondary control voltage VSCTRL decreases, the amount of delay introduced by current source 605 increases, forcing output signal OP to have a longer duty cycle (i.e., closer to 50%). Note that the rate of charging illustrated in FIG. 9A may be slightly exaggerated for purposes of illustration.

FIG. 9B illustrates a balanced duty cycle where signal OP has a high value substantially 50% of the time, and a low value substantially 50% of the time. Signal X, being an inverted version of Signal OP has a similar characteristic. Equi-current buffer 800 will charge and discharge in equal portions, as illustrated by signal C in FIG. 9B. As a result, secondary control voltage VSCTRL will remain constant so long as the duty cycle remains approximately 50%.

FIG. 9C illustrates an example where the duty cycle of signal OP exceeds 50% (exaggerated for the purposes of illustration, at nearly 80%). As illustrated in FIG. 9A, equi-current buffer 800 of FIG. 8 will output a charging signal for a longer duration of time than a discharging signal. The effect, over time, is to charge capacitor 606 and increase secondary control voltage VSCTRL. As secondary control voltage VSCTRL increases, the delay induced by current source 605 decreases, causing the duty cycle of output signal OP to decrease toward 50%.

As can be appreciated by the discussion of FIGS. 6, 7, 8 and 9, level shifter 600 and equi-current buffer 800 form a second feedback loop to maintain duty cycle at approximately 50%. This "dual loop" design allows a clock signal to be generated at 1x of a desired frequency with great accuracy without having to resort to the prior art 2x techniques.

Figure 10:
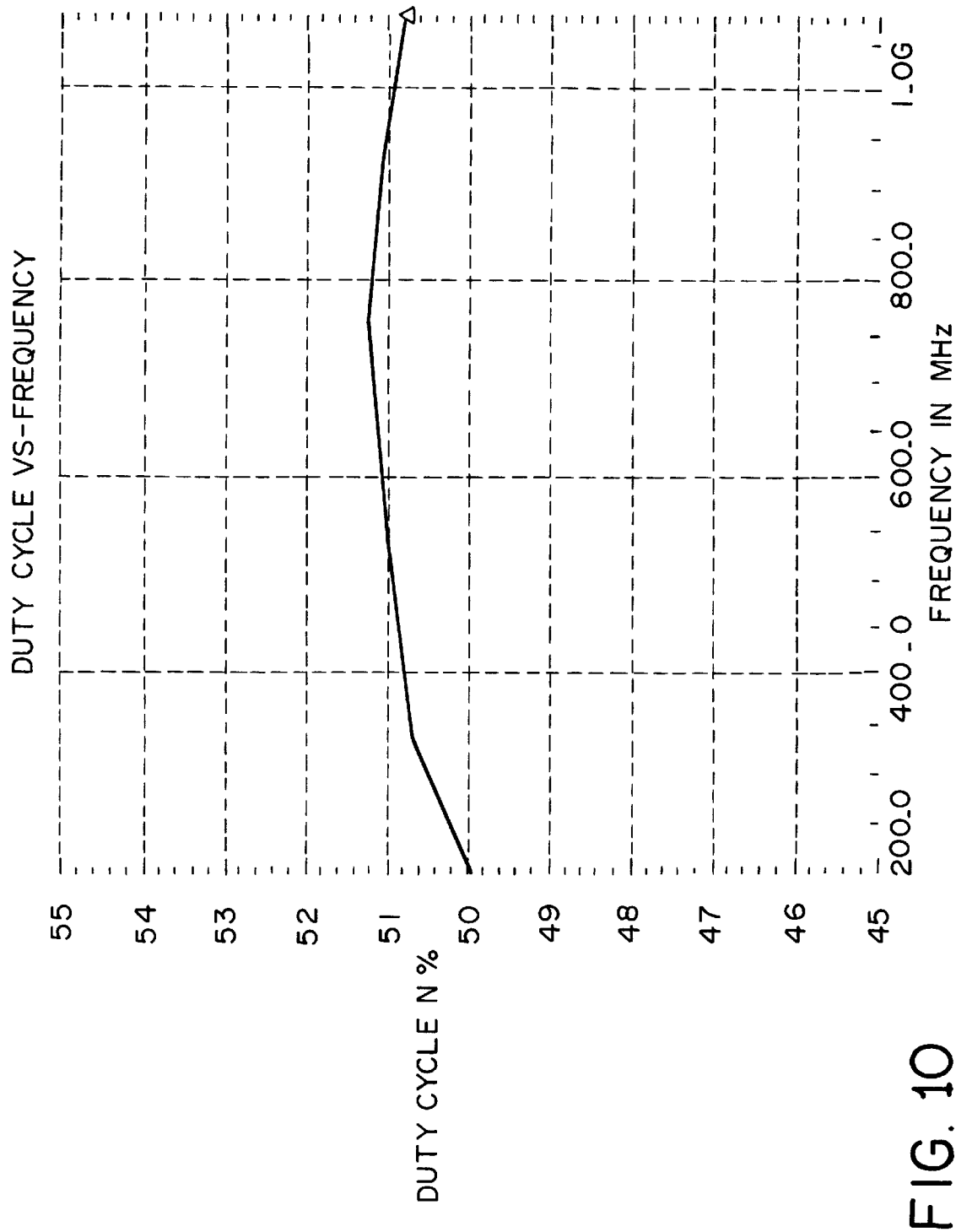
FIG. 10 is a graph illustrating the duty cycle performance of the apparatus of the present invention over a frequency range.

Moreover, the dual loop design of the present invention increases headroom for primary control voltage VCTRL such that a single oscillator design may be used to operate over a greater range of frequencies. FIG. 10 is a performance graph illustrating projected performance of the apparatus of the present invention as modeled using HSPICE simulation software.

In the graph of FIG. 10, the y-axis represents duty cycle in percentage points from 45 to 55. The x-axis represents operating frequency of output signal OP in MegaHertz. As illustrated in the graph of FIG. 10, the duty cycle of signal OP varies only slightly over a range of 200 MHz to over 1.0 GHz. In general, the range of 48.5 to 51.5% may be considered acceptable. In the present invention, duty cycle varies by less than 1.5% over the entire range.

Referring back to FIG. 8, the function of additional components of equi-current buffer 800 will now be discussed. In order to tightly control duty cycle at or near 50%, the charging and discharging currents generated by equi-current buffer 800 must be equal. In other words, the slope of the charging and discharging portions of signal C in FIGS. 9A–C must be equal. If the charging and discharging current are unequal, the secondary loop may stabilize at a point resulting in a non optimal (non 50%) duty cycle. Hence, the term equi-current buffer is used to describe the apparatus of FIG. 8.

In the apparatus of FIG. 8, control voltage VCTRL (or a voltage proportional thereto) may be applied to control overall current through the device. Signal VCTRL controls charging current through PMOS transistors 801P, 802P, and 803P which act essentially as current sources. Transistors 801N, 802N and 803N are configured as a current mirror so as to control discharge current accordingly.

Thus, signal VCTRL may control the level of charging and discharging currents within equi-current buffer 800 in proportion to clock frequency. At higher clock frequencies, charging and discharging currents may be increased in order charge or discharge capacitor 606 in a timely manner. At lower clock frequencies, it may be desirable to charge/discharge capacitor 606 at a slower rate, otherwise capacitor 606 may overshoot or undershoot a desired secondary control voltage VSCTRL within one cycle.

The circuit of FIG. 8 utilizes a regulated cascode design to achieve better current sources. In this embodiment of the VSCTRL is adjusted to be about a threshold voltage above ground. To make the drain to source voltage across current sourcing transistors 803P and 803N similar, transistors 808, 809 and 810 are provided to maintain the voltage drop across transistor 803P roughly equal to a threshold voltage (VTP).

Figure 11:
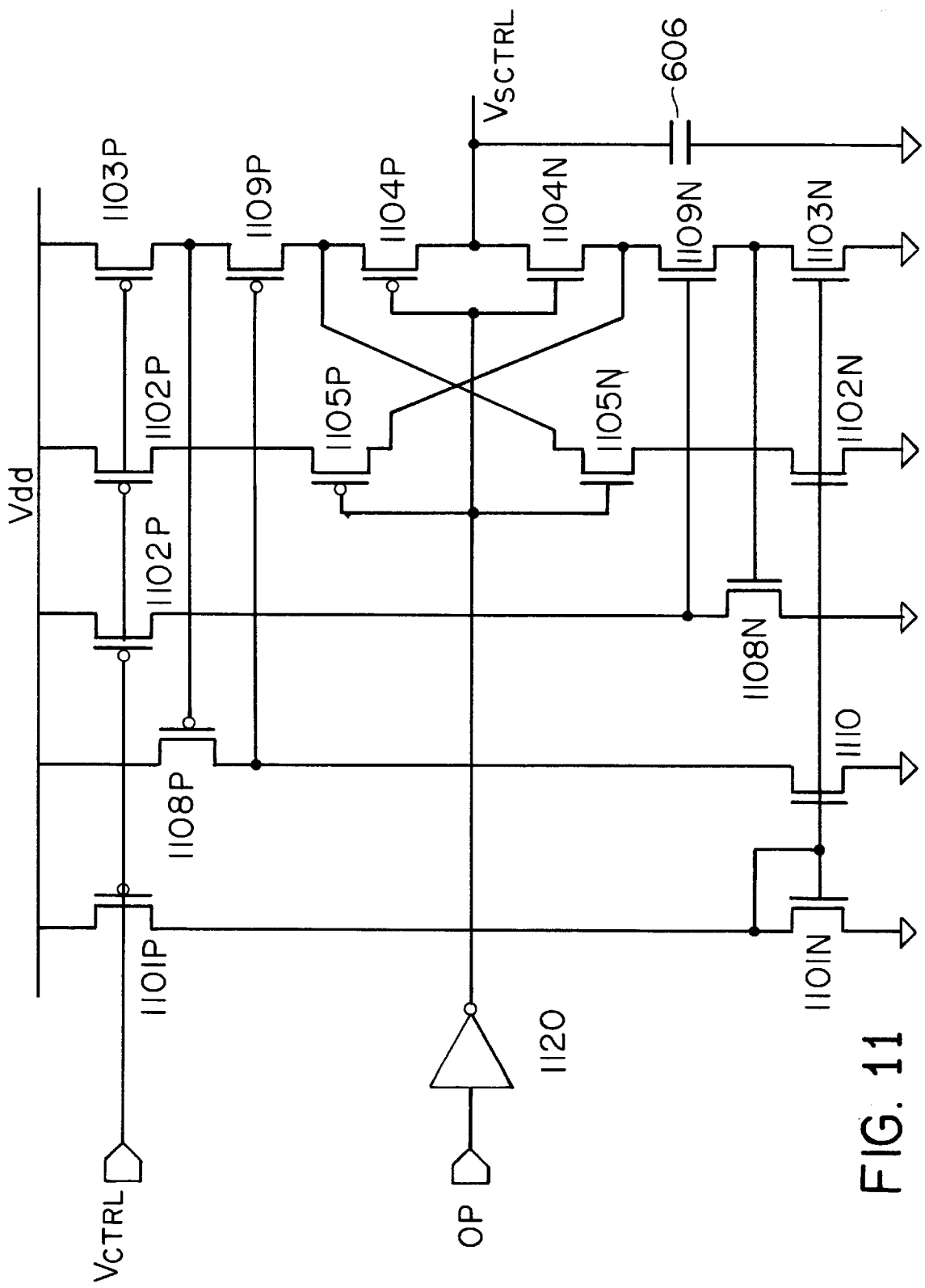
FIG. 11 is a schematic illustrating the major components of an alternative embodiment of the equi-current buffer.

FIG. 11 illustrates an alternative embodiment of the equi-current buffer of FIG. 8. In the circuit of FIG. 11, dual cascode circuits are provided on both charging and discharging legs of the equi-current buffer. In particular, transistors 1108N and 1109N have been added to the circuit of FIG. 8 to create a cascode circuit on the discharge leg. Such a scheme would be used if VSCTRL is adjusted to be about halfway between Vdd and Ground.

Figure 12:
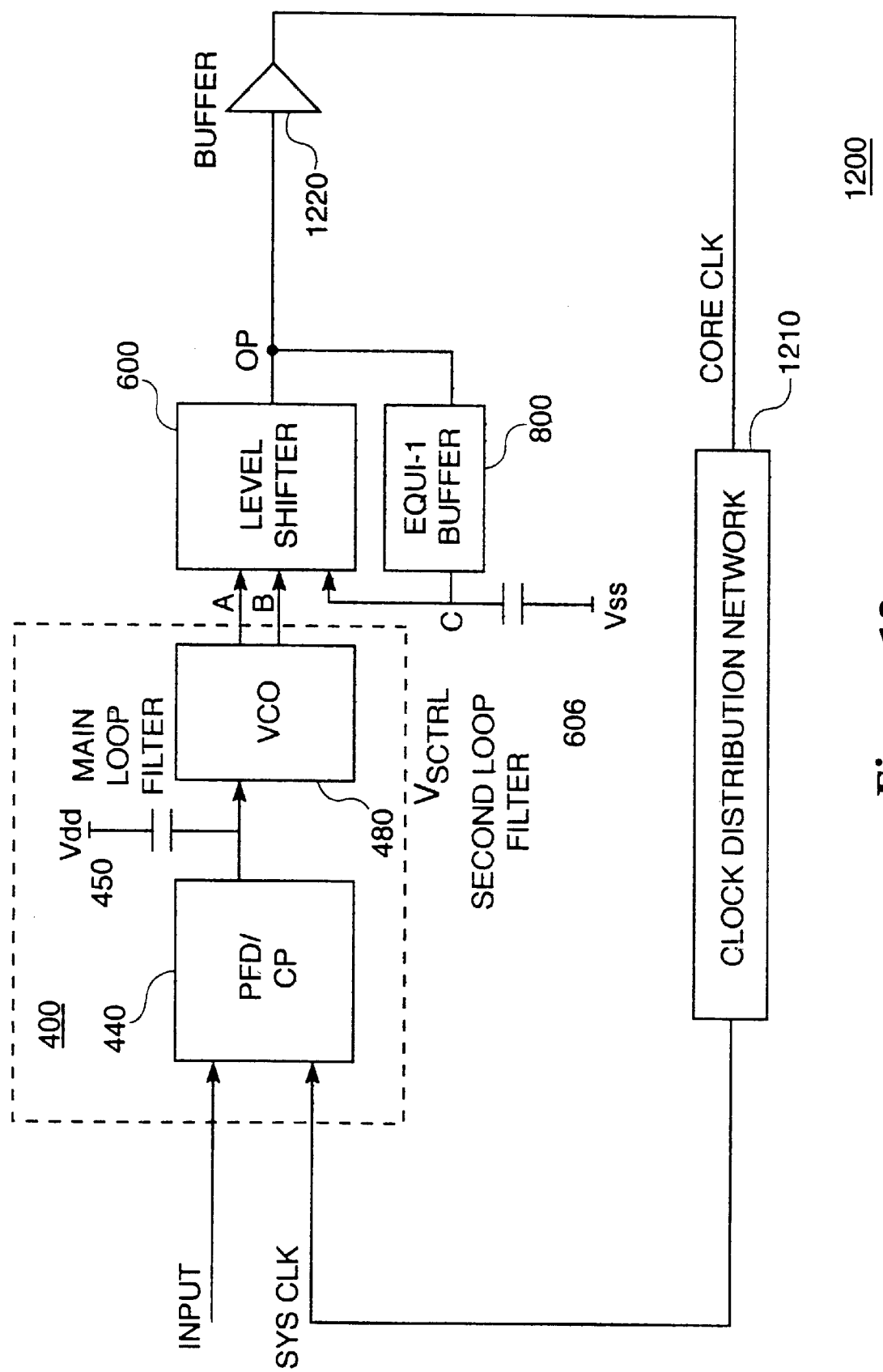
FIG. 12 is a simplified block diagram of a PLL clock generation system using the dual loop architecture of the present invention.

FIG. 12 provides an overall block diagram illustrating how the circuits of FIGS. 4, 6, and 8 may be combined. A buffer 1220 may be applied to the output OP of level shifter 600. Clock distribution network 1210 represents the clock tree of a semiconductor circuit. A suitably representative portion of clock distribution network 1210 may be tapped and fed back to phase frequency detector/charge pump.

While the preferred embodiment and various alternative embodiments of the invention have been disclosed and described in detail herein, it may be apparent to those skilled in the art that various changes in form and detail may be made therein without departing from the spirit and scope thereof.

For example, in the primary application of the present invention, a 50% duty cycle is preferred. However, one of ordinary skill in the art may appreciate that the apparatus of the present invention may be readily modified to produce clock signals having other desired duty cycle design points.

Similarly, minor details of the present invention may be altered without departing from the spirit and scope of the present invention. While illustrated as a five stage ring oscillator, oscillator 400 may have other numbers of stages (e.g., 3, 5, 7, and the like). Similarly, the logic levels of various signals may be altered without departing from the spirit and scope of the present invention. For example, in the preferred embodiment, current source 605 is utilized to delay the trailing edge of the clock signal OP. However, the leading edge of a clock signal could be delayed or advanced with similar effect.

What is claimed is:

1. An apparatus for generating a clock signal with a predetermined duty cycle, the apparatus comprising:
   an oscillator for generating a first clock signal;
   a delay element coupled to the oscillator for receiving the first clock signal and for generating a second clock signal and controllably delaying an edge of the second clock signal in response to a feedback signal; and
   a feedback signal generator, coupled to the delay element, for receiving the second clock signal and for generating the feedback signal in proportion to a duty cycle of the second clock signal,
   wherein the feedback signal controls said delay element to adjust the duty cycle of the second clock signal to a predetermined value, and
   wherein said delay element further includes a level shifter for raising a peak voltage level of the first clock signal and the first clock signal includes third and fourth clock signals at a predetermined frequency; said level shifter comprising:
      a first switch for generating a first clock edge of the second clock signal in response to the third clock signal;
      a second switch for generating a second clock edge of the second clock signal in response to the fourth clock signal; and
      a current source, coupled to said second switch for delaying switching of said second switch so as to delay generation of the second clock edge in the second clock signal.

2. The apparatus of claim 1, wherein said feedback signal generator comprises a charge pump for generating charging and discharging currents in proportion to the duty cycle of the second clock signal.

3. An apparatus for generating a clock signal with a predetermined duty cycle, the apparatus comprising:
   an oscillator for generating a first clock signal;
   a delay element coupled to the oscillator for receiving the first clock signal and for generating a second clock signal and controllably delaying a second clock edge of the second clock signal in response to a feedback signal; and
   a feedback signal generator, coupled to the delay element, for receiving the second clock signal and for generating the feedback signal in proportion to the duty cycle of the second clock signal,
   wherein the feedback signal controls said delay element to adjust the duty cycle of the second clock signal to a predetermined value,
   wherein said feedback signal generator comprises a charge pump for generating charging and discharging currents in proportion to the duty cycle of the second clock signal, and
   wherein said delay element includes a level shifter for raising a peak voltage level of the first clock signal and the first clock signal includes third and fourth clock signals at a predetermined frequency; said level shifter comprising:
      a first switch for generating a first clock edge of the second clock signal in response to the third clock signal;
      a second switch for generating the second clock edge of the second clock signal in response to the fourth clock signal; and
      a current source, coupled to said second switch for delaying switching of said second switch so as to delay generation of the second clock edge in the second clock signal.

4. The apparatus of claim 3 wherein said oscillator comprises a ring oscillator outputting a plurality of clock signals, including the third and fourth clock signals, at different phases relative to one another.

5. The apparatus of claim 4, wherein said first switch comprises:
   a first transistor receiving the third clock signal and for generating a rising edge of the second clock signal in response to a rising edge of the third clock signal.

6. The apparatus of claim 5, wherein said second switch comprises:
   a second transistor receiving the fourth clock signal and for generating a trailing edge of the second clock signal in response to the rising edge of the fourth clock signal.

7. The apparatus of claim 6, wherein said level shifter further comprises a current mirror coupled to a supply voltage, said current mirror having a first leg coupled to said first transistor and a second leg coupled to said second transistor.

8. The apparatus of claim 7, wherein the current source couples the second transistor to ground, for delaying generation by said second transistor of the trailing edge of the second clock signal.

9. An apparatus for generating a clock signal with a predetermined duty cycle, the apparatus comprising:

an oscillator for generating a first clock signal;

a delay element coupled to the oscillator for receiving the first clock signal and for generating a second clock signal and controllably delaying an edge of the second clock signal in response to a feedback signal; and a feedback signal generator, coupled to the delay element, for receiving the second clock signal and for generating the feedback signal in proportion to the duty cycle of the second clock signal, wherein the feedback signal controls said delay element to adjust the duty cycle of the second clock signal to a predetermined value, wherein said feedback signal generator comprises a charge pump for generating charging and discharging currents in proportion to the duty cycle of the second clock signal, and wherein said charge pump comprises:

a first pair of transistors of a first type receiving a supply voltage and the second clock signal, said first pair of transistors conducting during a first portion of a clock cycle of the second clock signal and outputting a charging current during the first portion of the clock cycle; and a second pair of transistors of a second type coupled to ground and receiving the second clock signal, said second pair of transistors conducting during a second portion of a clock cycle of the second clock signal and outputting a discharging current during the second portion of the clock cycle.

10. The apparatus of claim 9, wherein said charge pump further comprises:

a plurality of current sources, each coupled to a corresponding one of each transistor of said first pair of transistors and said second pair of transistors, for controlling amplitude of the charging current and the discharging current.

11. The apparatus of claim 10, wherein said charge pump further comprises:

a current control signal input for receiving a current control signal proportional to clock signal frequency, said current control signal input coupled to said plurality of current sources for controlling amplitude of current through said current sources in proportion to clock signal frequency.

12. The apparatus of claim 11, wherein said current control signal comprises a voltage control signal of the oscillator.

13. The apparatus of claim 12, wherein said charge pump further comprises:

a current shunt for shunting current from said first pair of transistors during the second portion the clock cycle of the second clock signal.

14. A method for generating a clock signal with a predetermined duty cycle, the method comprising the steps of:

generating a clock signal;

controllably delaying an edge of the clock signal in response to a feedback signal;

generating the feedback signal in proportion to the duty cycle of the clock signal; and raising a peak voltage level of the clock signal using a level shifter, wherein the feedback signal adjusts the duty cycle of the clock signal to a predetermined value, wherein the step of generating a feedback signal comprises the step of generating charging and discharging currents in proportion to the duty cycle of the clock signal, and wherein the step of delaying an edge of the clock signal comprises the step of introducing a delay into an edge of the clock signal using a current source controlled by a control voltage across a capacitor charged by the charging and discharging currents.

15. A method for generating a clock signal with a predetermined duty cycle, the method comprising the steps of:

generating a clock signal;

controllably delaying an edge of the clock signal in response to a feedback signal;

generating the feedback signal in proportion to the duty cycle of the clock signal;

generating a plurality of timing signals with an oscillator including a first timing signal and a second timing signal both at a predetermined frequency;

generating a first clock edge of the clock signal in response to the first timing signal;

generating a second clock edge in the clock signal in response to the second timing signal; and delaying generation of the second clock edge in the clock signal, wherein the feedback signal adjusts the duty cycle of the clock signal to a predetermined value, wherein the step of generating a feedback signal comprises the step of generating charging and discharging currents in proportion to the duty cycle of the clock signal, and wherein the step of delaying an edge of the clock signal comprises the step of introducing a delay into an edge of the clock signal using a current source controlled by a control voltage across a capacitor charged by the charging and discharging currents.

16. The method of claim 15 wherein said step of generating a clock signal comprises the step of generating in a ring oscillator, a plurality of clock signals, including the first and second timing signals, at different phases relative to one another.

17. The method of claim 16, wherein said step of generating a first clock edge comprises the steps of:

receiving the first timing signal; and generating a rising edge of the clock signal in response to a rising edge of the first timing signal.

18. The method of claim 17, wherein said step of generating a second clock edge comprises the steps of:

receiving the second timing signal; and generating a trailing edge of the clock signal in response to the rising edge of the second timing signal.

19. The apparatus of claim 15, wherein said step of generating charging and discharging currents comprises the steps of:

outputting a charging current during a first portion of the clock cycle; and outputting a discharging current during a second portion of the clock cycle.

20. The method of claim 19, wherein said step of generating charging and discharging currents further comprises the steps of:

shunting charging current during the second portion the clock cycle of the clock signal.

21. An apparatus for generating a clock signal with a predetermined duty cycle, the apparatus comprising:

an oscillator for generating a first clock signal;

a delay coupled to the oscillator for receiving the first clock signal and for generating a second clock signal and controllably delaying an edge of the second clock signal in response to a feedback signal said delay including a level shifter for raising a peak voltage level of the first clock signal, the first clock signal including a third clock signal and a fourth clock signal; each at a predetermined frequency; said level shifter comprising:

a first transistor for generating a first clock edge of the second clock signal in response to the third clock signal, a second transistor for generating a second clock edge of the second clock signal in response to the fourth clock signal, and a current source, coupled to said second transistor for delaying switching of said second transistor so as to delay generation of the second clock edge in the second clock signal; and a feedback signal generator, coupled to the delay, for receiving the second clock signal and for generating the feedback signal proportional to a duty cycle of the second clock signal, said feedback signal controlling said delay to adjust the duty cycle of the second clock signal to a predetermined value.

* * * * *